(12) United States Patent
Sano et al.

(10) Patent No.: US 6,881,240 B2
(45) Date of Patent: Apr. 19, 2005

(54) COPPER POWDER FOR ELECTRICALLY CONDUCTIVE PASTE

(75) Inventors: Kazushi Sano, Okayama (JP); Yoshihiro Okada, Okayama (JP); Hiromasa Miyoshi, Okayama (JP)

(73) Assignee: Dowa Mining Co., Ltd., Tokyo (JP)

( * ) Notice: Subject to any disclaimer, the term of this patent is extended or adjusted under 35 U.S.C. 154(b) by 122 days.

(21) Appl. No.: 10/319,529

(22) Filed: Dec. 16, 2002

(65) Prior Publication Data

US 2003/0089199 A1 May 15, 2003

Related U.S. Application Data

(63) Continuation of application No. 09/663,929, filed on Sep. 18, 2000, now abandoned.

(51) Int. Cl.[7] .................................................. B22F 1/00
(52) U.S. Cl. ............................. 75/255; 75/252; 75/373; 428/570
(58) Field of Search ......................... 75/255, 373, 252; 428/570

(56) References Cited

U.S. PATENT DOCUMENTS

| | | | |
|---|---|---|---|
| 4,600,604 A | * | 7/1986 | Siuta .......................... 428/403 |
| 5,741,347 A | | 4/1998 | Miki |
| 6,080,336 A | * | 6/2000 | Suehiro et al. ............. 252/514 |
| 6,174,344 B1 | * | 1/2001 | Hayashi et al. ............... 75/255 |

FOREIGN PATENT DOCUMENTS

| | | |
|---|---|---|
| JP | 62-99406 | 5/1987 |
| JP | 2-197012 | 8/1990 |
| JP | 4-116109 | 4/1992 |
| JP | 2000-144217 | 5/2000 |

* cited by examiner

Primary Examiner—Ngoclan T. Mai
(74) Attorney, Agent, or Firm—Clark & Brody

(57) ABSTRACT

When copper powder manufactured by a wet reduction method is kneaded with resin in a high filling rate, it is difficult to maintain a low viscosity. The invention is to solve the problem of high viscosity without changing the characteristics such as particle size and specific surface area of the copper powder obtained by a wet reduction method. This invention relates to copper powder for an electrically conductive paste wherein copper powder manufactured by a wet reduction method is subjected to a surface-flattening treatment in which the particles are mechanically collided each other.

9 Claims, 6 Drawing Sheets

Fig. 1
Copper powder A 1
(a)
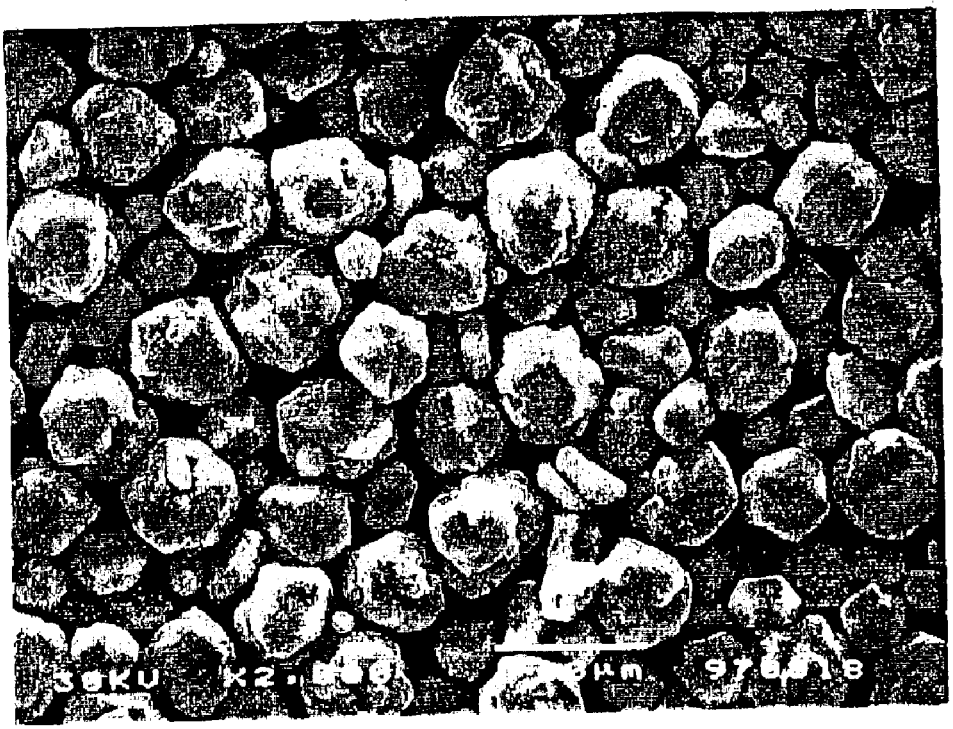
(b)
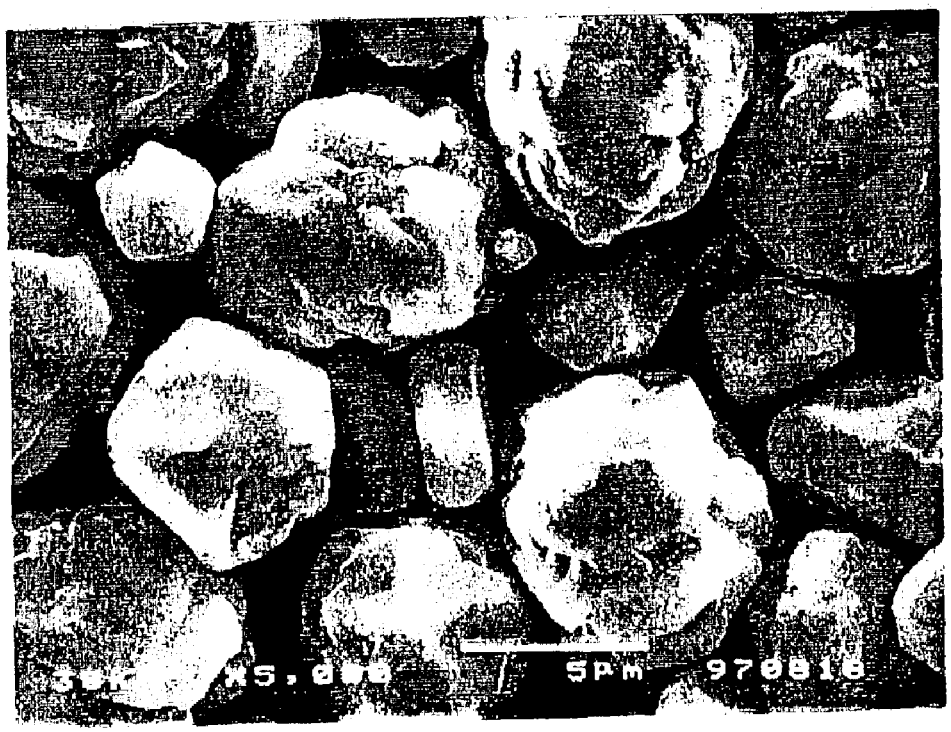

Fig. 2
Copper powder A 2
(a)
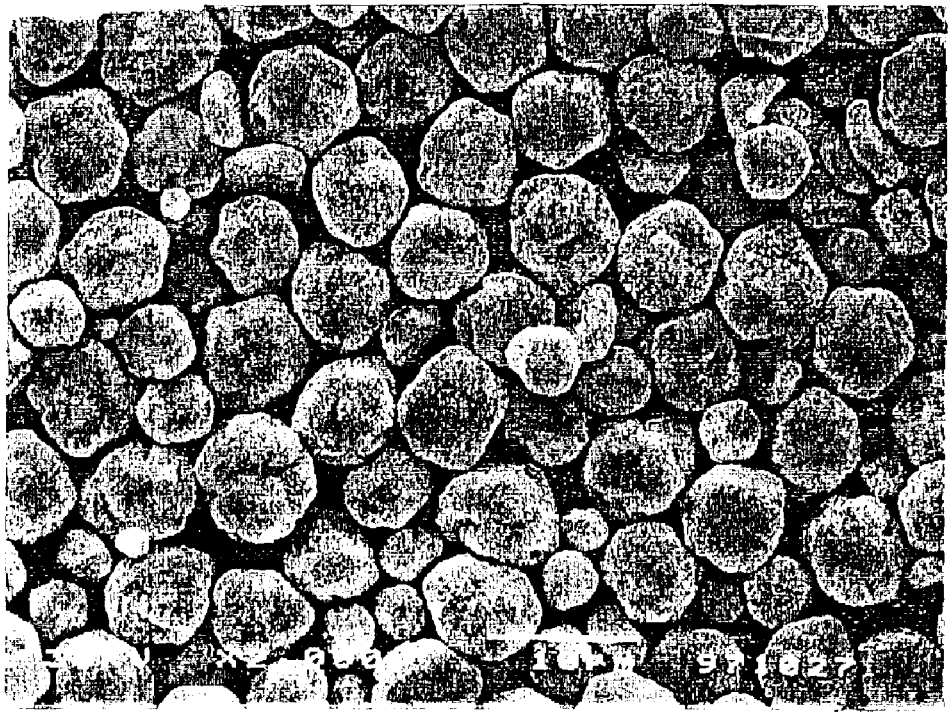
(b)
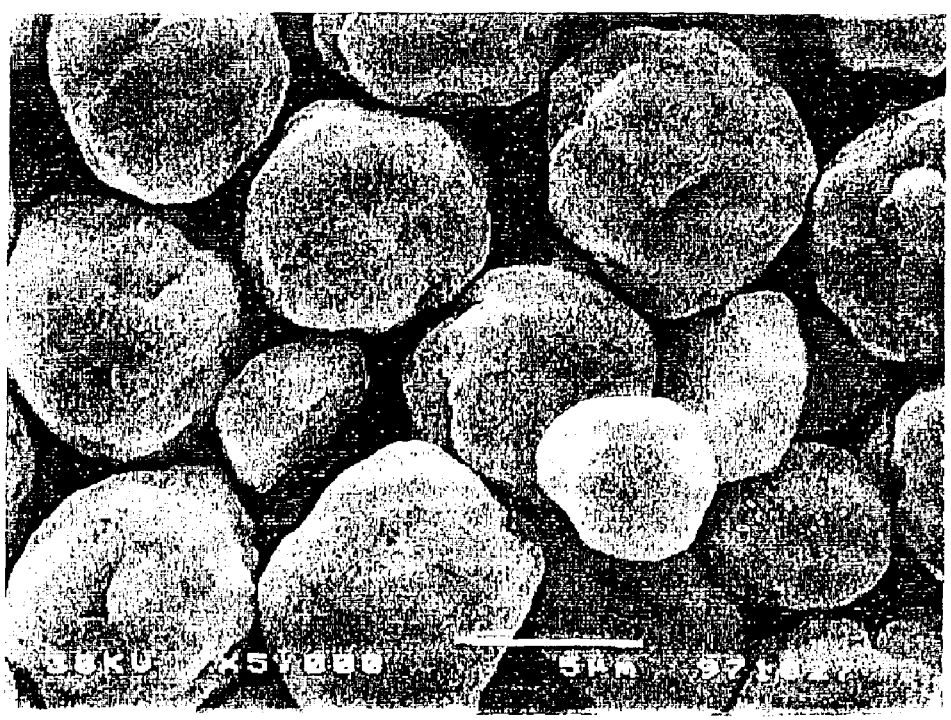

Fig. 3
Copper powder B 1
(a)
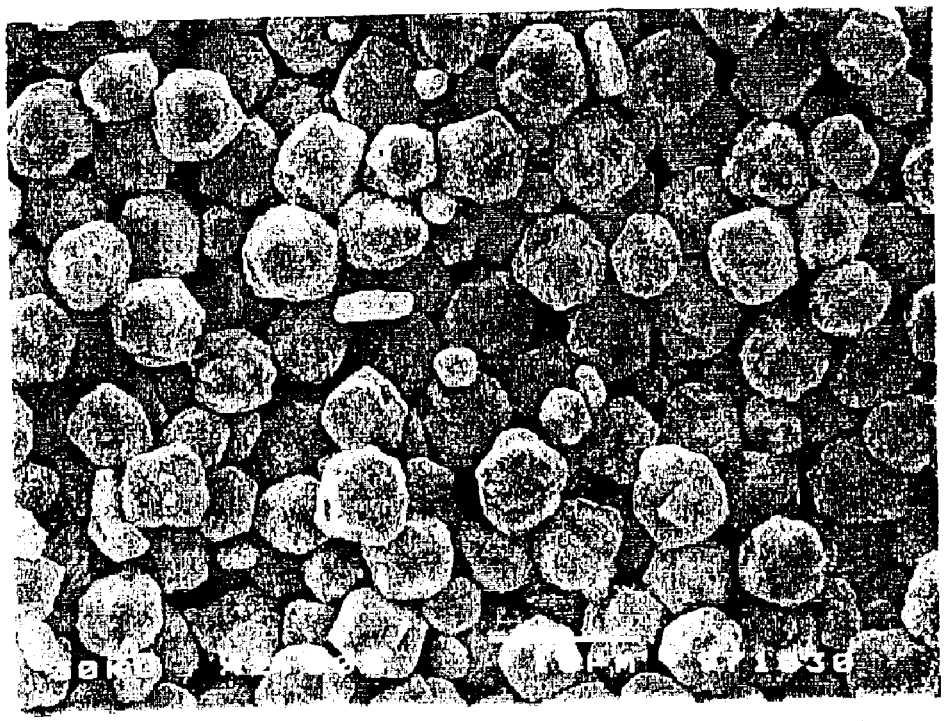
(b)
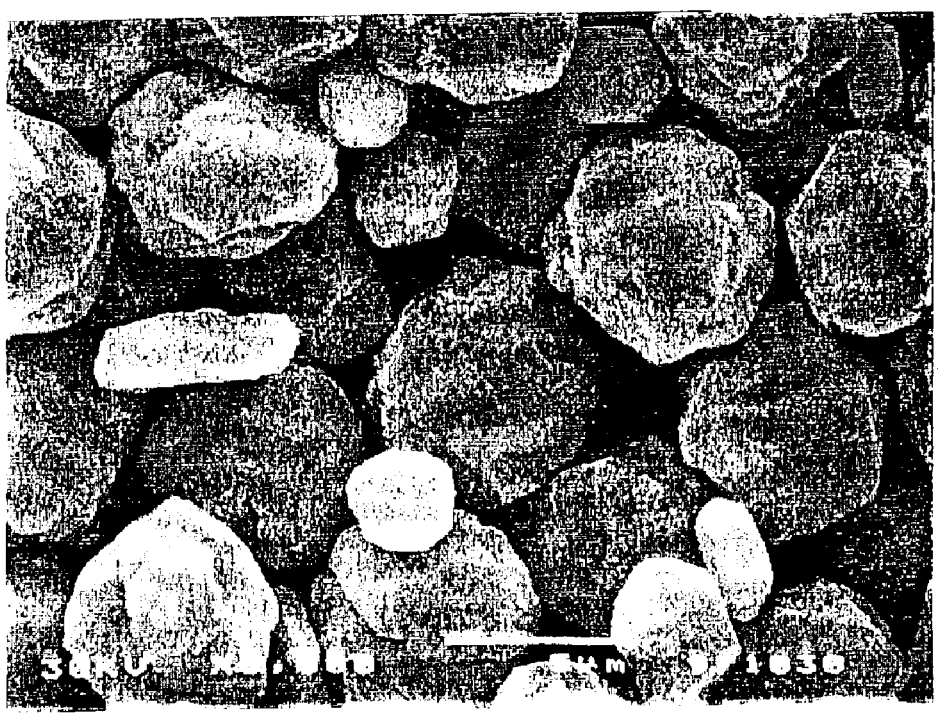

Fig. 4
Copper powder B 2
(a)
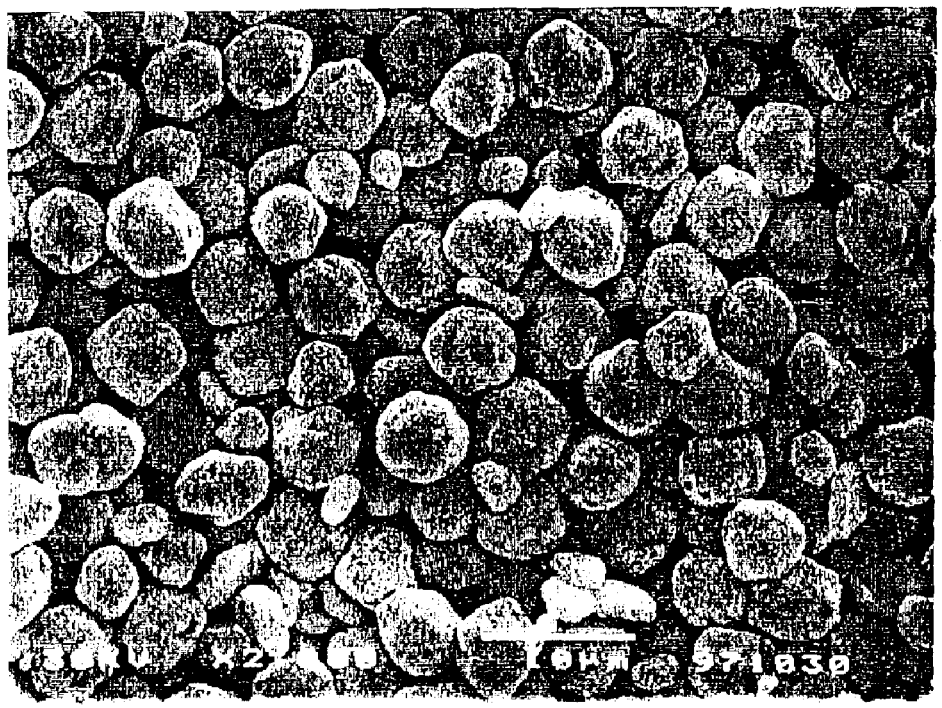
(b)
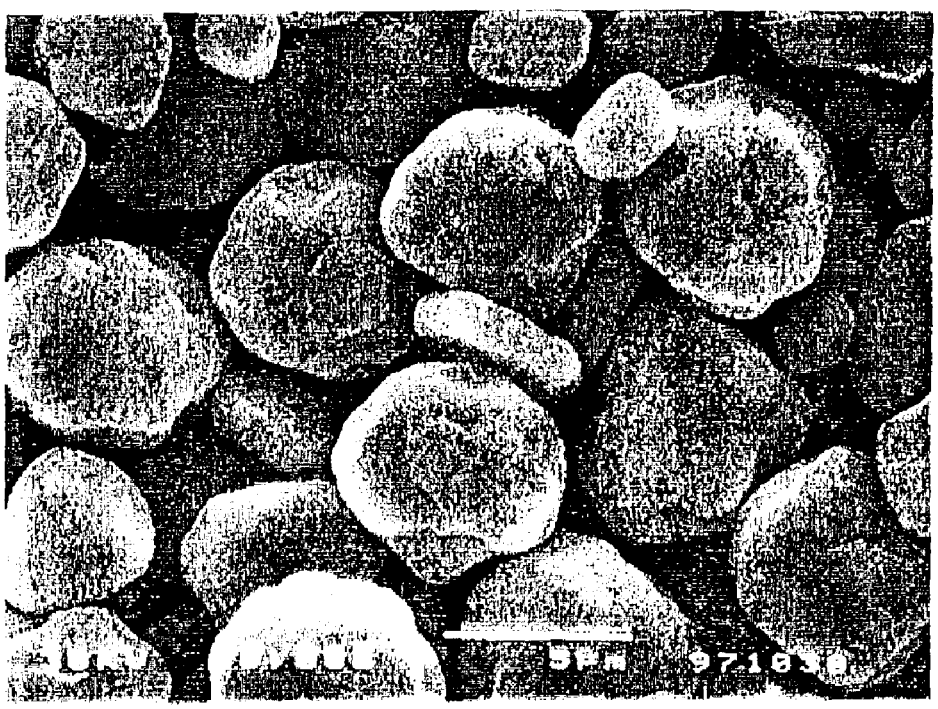

Fig. 5   Copper powder C 1
(a)
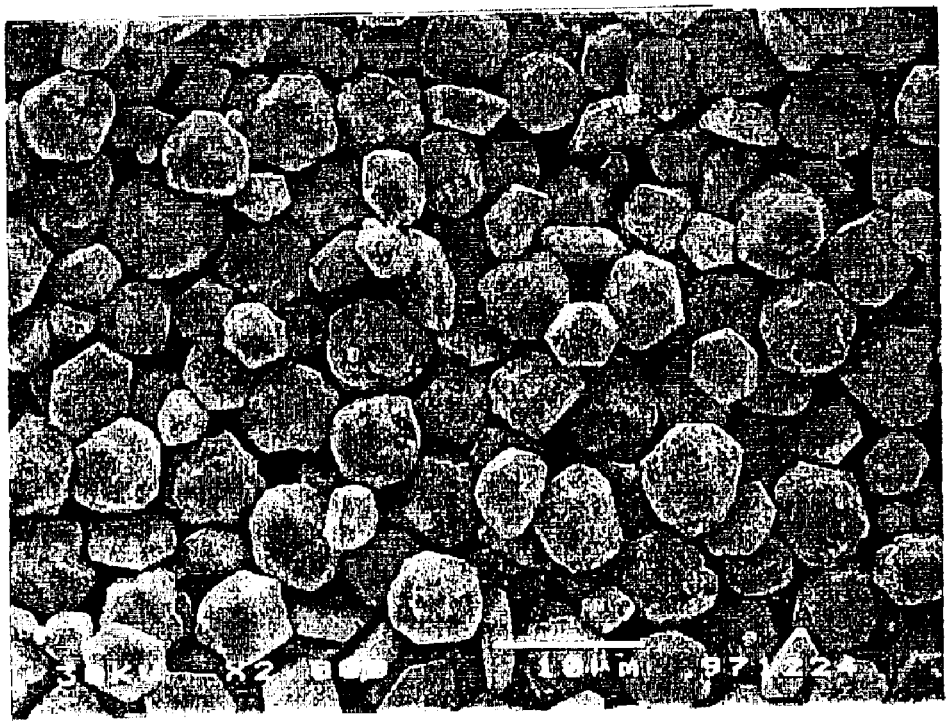
(b)
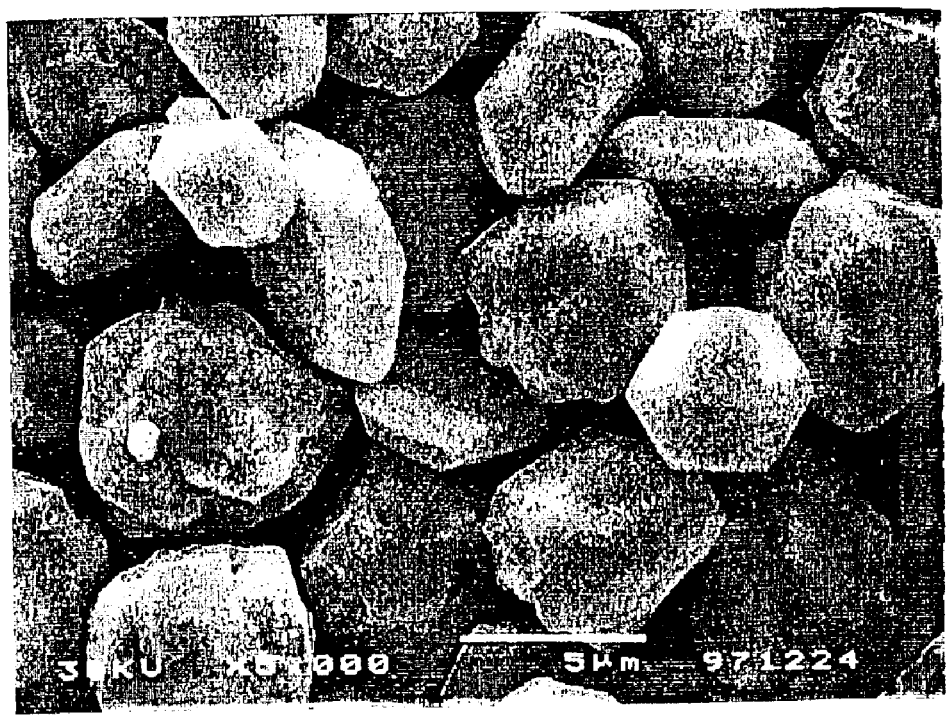

Fig. 6
Copper powder C 2
(a)
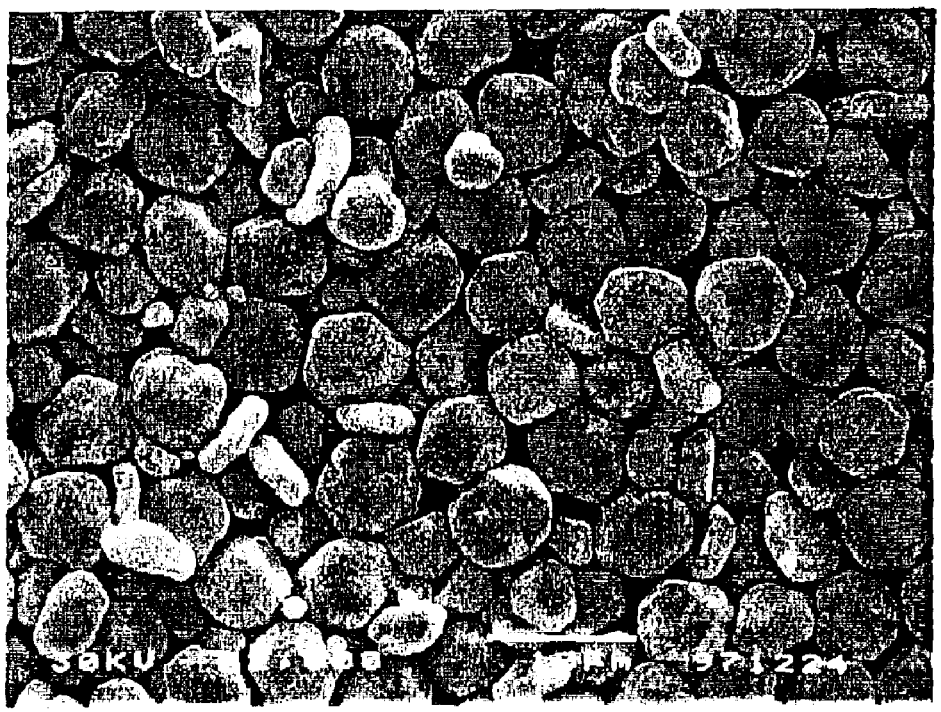
(b)
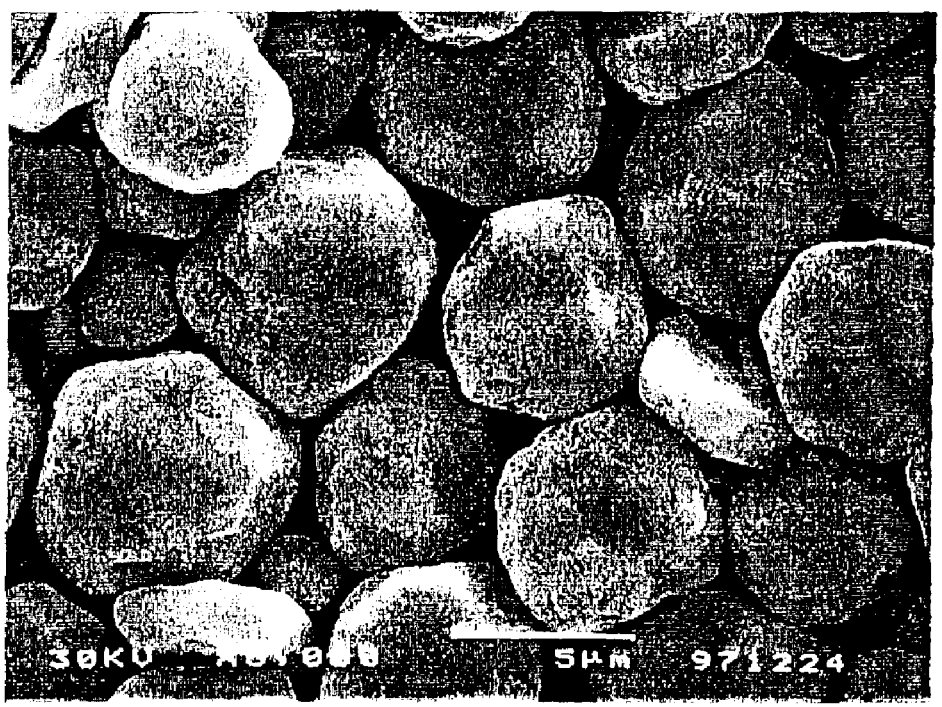

COPPER POWDER FOR ELECTRICALLY CONDUCTIVE PASTE

This application is a continuation of U.S. Ser. No. 09/663,929, filed Sep. 18, 2000 now abandoned.

BACKGROUND OF THE INVENTION

1. Field of the Invention

The present invention relates to a copper powder wherefrom an electrically conductive paste showing low viscosity even at a high filling rate is prepared.

2. Description of the Related Art

When a thick film circuit substrate is prepared by a screen printing of an electrically conductive paste on an insulation substrate, a paste of silver type has been mainly used as the electrically conductive paste although there is a tendency of using a paste of copper type as well. This is because the paste of copper type has the following advantages as compared with that of silver type.

(1) Since migration hardly takes place, short circuit rarely happens.

(2) Since resistance to soldering is excellent, reliability is high.

(3) Cost reduction is possible.

The copper paste having such advantages can be prepared by dispersion of copper powder having a particle size of around 0.1–1 μm in a vehicle (resin).

With regard to a method for the manufacture of copper powder, there have been known mechanical grinding, atomizing method where melted copper is sprayed, electrolytic deposition method to cathode, vaporization-deposition method, wet reduction method and the like. Although each of them has its own merit and disadvantages, a wet reduction method is mainstream for the manufacture of copper powder for electrically conductive paste because it is able to relatively easily give fine powder having a particle size suitable for the paste. A method for the manufacture of copper powder by a wet reduction method is mentioned, for example, in JPA-Hei-4-116109, JPA-Hei-2-197012 and JPA-Shou-62-99406.

Gist of a method for the manufacture of copper powder by a wet reduction method is that copper hydroxide precipitated in water is subjected to a primary reduction to cuprous oxide and then the cuprous oxide is subjected to a secondary reduction to give metal copper where glucose or the like is used as a primary reducing agent while hydrazine hydrate or the like is used as a secondary reducing agent. At that time, particle size and particle shape of the resulting copper powder can be controlled by adjusting the conditions for a precipitating step of copper hydroxide and primary and secondary reducing steps and there is an advantage that a product having a particle size suitable for electrically conductive paste can be manufactured in a stable manner. In JPA-2000-144217, the present inventors already proposed a method of carrying out an oxidizing treatment by blowing-in of oxygen-containing gas between the primary and the secondary reducing steps. As a result of the oxidizing treatment, copper powder having a uniform particle size can be prepared and control of particle size and of particle shape can be made much more precise.

Even if the copper powder having a particle size suitable for electrically conductive paste is manufactured, there is still a problem in the wet reduction method when the resulting copper powder is to be used for preparing an electrically conductive paste having an appropriate viscosity. Viscosity of the used resin itself, filling rate (filler value) of copper powder and particle size distribution participate in the viscosity of an electrically conductive paste, however, in the copper powder by a wet reduction method, the viscosity of the paste tends to be increased. That is, it has been found that only an appropriate control of the particle size (even if it can be done) has a limit for lowering the viscosity of the electrically conductive paste in the copper powder by a wet reduction method.

SUMMARY OF THE INVENTION

Accordingly, the invention is to solve such problems and to prepare copper powder which can ensure the viscosity necessary for an electrically conductive paste even when the copper powder prepared by a wet reduction method is used.

In order to solve the problems, the present inventors have carried out an intensive study and found that viscosity of an electrically conductive paste can be significantly lowered when the copper powder prepared by the wet reduction method is subjected to a treatment where the copper powder is mechanically collided each other so that the particle surface is made smooth without causing so big change in particle size, particle size distribution and specific surface area. Thus, unevenness and angular parts existing on the particle surface are made smooth by collision of particles each other without substantial changes in particle size and particle size distribution, and such a treatment can be carried out using an apparatus which is able to mechanically fluidize the particles.

Accordingly, the invention is to provide copper powder for an electrically conductive paste in which the copper powder manufactured by a wet reduction method is subjected to a surface smoothing treatment by a mechanical collision of the particles each other. The copper powder of the invention has an average particle size of 0.1–10 μm. When 92% by weight of the powder of the invention is kneaded with 8% by weight of an epoxy resin being prepared by glycidylation of dimeric acid, having an epoxy equivalent of 446 and having a viscosity of 0.73 Pa.sec at 25° C. and viscosity of the kneaded mixture is measured by a viscometer of type B at 10 rpm, the mixture shows a viscosity of not more than 300 Pa.sec.

BRIEF DESCRIPTION OF THE DRAWINGS

FIG. 1 is a picture under a SEM of the copper powder A1 obtained by subjecting the copper powder cake A to a disintegrating treatment in which (a) is a picture of 2000 magnifications and (b) is a picture of 5000 magnifications;

FIG. 2 is a picture under a SEM of the copper powder A2 obtained by subjecting the copper powder cake A to a fluidizing treatment in which (a) is a picture of 2000 magnifications and (b) is a picture of 5000 magnifications:

FIG. 3 is a picture under a SEM of the copper powder B1 obtained by subjecting the copper powder cake B to a disintegrating treatment in which (a) is a picture of 2000 magnifications and (b) is a picture of 5000 magnifications;

FIG. 4 is a picture under a SEM of the copper powder B2 obtained by subjecting the copper powder cake B to a fluidizing treatment in which (a) is a picture of 2000 magnifications and (b) is a picture of 5000 magnifications;

FIG. 5 is a picture under a SEM of the copper powder C1 obtained by subjecting the copper powder cake C to a disintegrating treatment in which (a) is a picture of 2000 magnifications and (b) is a picture of 5000 magnifications; and FIG. 6 is a picture under a SEM of the copper powder C2 obtained by subjecting the copper powder cake C to a fluidizing treatment in which (a) is a picture of 2000 magnifications and (b) is a picture of 5000 magnifications.

DESCRIPTION OF PREFERRED EMBODIMENTS

As mentioned above, the copper powder which is manufactured by the so-called wet reduction method wherein a reducing agent is added to a suspension where copper hydroxide is suspended in water to carry out a primary reduction giving cuprous oxide and then a reducing agent is added to a suspension where the cuprous oxide is suspended in water to carry out a secondary reduction is obtained as being suitable for an electrically conductive paste in both terms of particle size and particle shape. For example, a product in which an average particle size is 0.1–10 $\mu$m, preferably 3–10 $\mu$m or, more preferably, 4–8 $\mu$m and a specific surface area (as measured by a BET method) is 0.1–10 $m^2/g$ or, preferably, 0.1–1.0 $m^2/g$ can be obtained in a stable manner. However, even when the particles have a sphere-like shape, they are actually in a polyhedral shape where flat crystalline surfaces are polyhedrally exposed and, therefore, there are angular parts at the side of the crystal faces whereby the particle surface is in an uneven state as a whole. Such an angular surface state is fundamentally different from that which is subjected to a fusing treatment such as atomized powder.

It has been in the meanwhile found that such an angularity (unevenness) is a hindrance for lowering the viscosity of an electrically conductive paste. Thus, that is the reason why the copper powder obtained by a wet reduction method is unable to lower the viscosity of an electrically conductive paste. The present inventors have found that the viscosity of an electrically conductive paste can be significantly lowered when the angular part is made into a smooth curve plane without changing the particle size and the specific surface area of the copper powder. Thus, it has been found that, before dispersing into the resin, when a pretreatment where the particles are mechanically collided is carried out to reduce the angular parts and the resulting particles having the smooth curve plane are dispersed, viscosity can be significantly lowered as compared with the substance before the treatment.

This treatment can be carried out by fluidization of the powder and it is convenient that the fluidization is conducted by an apparatus for a mechanical fluidization of powder such as a cylindrical high-speed stirrer (fluidizing mixer). Thus, according to a process wherein momentum is given to each particle and the moving particles are collided each other to flatten the angular part of the particle surface, it is possible to make the surface of each particle smooth with rare changes in particle size and specific surface area. The cylindrical high-speed stirrer is able to give centrifugal force and floating force to the powder by moving blades placed at the lower area of the inside of the cylindrical tightly-closed container (cylindrical container where an axis is in a vertical direction) whereby the powder flows in the container and, during the flowing, the surface is made smooth.

In the final stage of the wet reduction method, fine powder of metal copper produced in the liquid is separated from the liquid, and then water is removed from the separated solid. Since the resulting substance after the dry treatment is in a so-called cake-like form, it is to be disintegrated by a disintegrating machine so that particles thereof are separated each other. In the disintegrating machine, shock is applied to the adhered particles to dissociate, and it is not so much expected that unevenness of the particle surface is removed to give smooth surface. Therefore, when the copper powder is in a state of just being disintegrated from the copper powder cake, it shows a high viscosity when dispersed into resin. For example, as shown in the Examples which will be mentioned later, when 92% by weight of this disintegrated copper powder are kneaded with 8% by weight of an epoxy resin having an epoxy equivalent of 446 g/eq and a viscosity of 0.73 Pa.sec at 25° C. prepared by a glycidylation of dimeric acid and the viscosity of the kneaded mixture is measured at 10 rpm using a viscometer of type B, the viscosity is usually not less than 400 Pa.sec and the viscosity of as low as not more than 300 Pa.sec or, in some cases, not more than 200 Pa.sec can be never expected.

On the contrary, it has been found that, in the case of the copper powder where the surface smoothing treatment is carried out by a mechanical collision of particles as mentioned above, although the copper itself is prepared by the same wet reduction method, the viscosity of the kneaded mixture prepared by kneading of 92% by weight of this surface-smoothed copper powder with 8% by weight of an epoxy resin having an epoxy equivalent of 446 g/eq and a viscosity of 0.73 Pa.sec at 25° C. prepared by glycidylation of a dimeric acid as same as before is usually not more than 300 Pa.sec when measured at 10 rpm using a viscometer of type B or is as low as 250 Pa.sec or lower or, in some cases, 200 Pa.sec or lower.

In addition, even in the case where the copper powder manufactured by a wet reduction method is coated with an inorganic or organic substance before a surface smoothing treatment is carried out by a mechanical collision of the particles, it has been found to give the same low viscosity as well. In the copper powder for an electrically conductive paste, it is also advantageous to coat the copper particle surface with metal such as silver for further improvement of electric conductivity or to coat it with an organic compound such as carboxylic acid (e.g., stearic acid) for prevention of the oxidation of the surface and, in the case of the manufacture of copper powder by a wet reduction method, such a coating treatment can be carried out at its final stage. When the copper powder coated as such is subjected to a surface-smoothing treatment by a mechanical collision of the particles each other, it has been found that the surface can be made smooth without damaging the coated part and accordingly that an electrically conductive paste of a low viscosity can be prepared while having the characteristics due to the coating.

EXAMPLES

An aqueous solution of copper sulfate and an aqueous solution of sodium hydroxide are mixed in terms of an equivalent ratio of 1.25 mol of sodium hydroxide to 1 mol of copper to give a suspension wherefrom copper hydroxide is precipitated. To this suspension is added a glucose solution in an equivalent amount or more and, after that, temperature of the liquid is raised up to 70° C. within 30 minutes and then kept for 15 minutes whereupon a primary reduction of copper hydroxide to cuprous oxide takes place. All treating operations until that are carried out in a nitrogen atmosphere. After air is bubbled into the liquid to oxidize, the mixture is allowed to stand in a nitrogen atmosphere for 2 days, the supernatant liquid is removed, nearly all of the precipitate is collected, pure water is added to the precipitate and hydrazine hydrate in an equivalent or more amount to the resulting suspension whereupon a secondary reduction to metal copper takes place. The suspension after completion of the reaction is separated into solid and liquid, and the solid is dried in a nitrogen atmosphere of 120° C. to give a copper powder cake.

In the above method for the manufacture of copper powder by a wet reduction method, only the time period for the oxidation treatment with an air bubbling was changed whereupon three kinds of copper powder cakes A, B and C were prepared. Each of the resulting cakes was divided into two, one of which was placed in a disintegrating machine and disintegrated in a nitrogen atmosphere to give copper powders A1, B1 or C1. Another was placed in a cylindrical high-speed stirrer and subjected to a fluidizing treatment in a nitrogen atmosphere to give copper powders A2, B2 or C2.

The disintegrating machine used for the disintegrating treatment is a grinding machine of an impact type equipped with a swinging hammer therein and the aggregated and dried copper powder cake is disintegrated into fine particles obtained in the final step of the wet reduction method but the machine has almost no function of smoothing the particle surface. The cylindrical high-speed stirrer used for the fluidizing treatment is a mixer having two moving blades at the base of the cylindrical container where the axis is vertical and, in the stirrer, the powder to which centrifugal force is given by rotation of the blades flows upward and the particles are repeatedly collided each other during the flowing whereupon the unevenness of the particle surface is made smooth.

Picture under a SEM of the copper powder A1 obtained by a disintegrating treatment of the copper powder cake A and picture under a SEM of the copper powder A2 obtained by a fluidizing treatment thereof are shown in FIG. 1 and FIG. 2, respectively in which (a) is a picture of 2000 magnifications and (b) is that of 5000 magnifications. Similarly, pictures under a SEM of the copper powders B1 and C1 obtained by a disintegrating treatment of the copper powder cakes B and C and pictures under a SEM of the copper powders B2 and C2 obtained by a fluidizing treatment thereof are shown in FIGS. 3–4 and FIGS. 5–6, respectively in which (a) is a picture of 2000 magnifications and (b) is that of 5000 magnifications. In addition, an average particle size of each copper powder was checked from those pictures under a SEM and, at the same time, specific surface area by a BET method, bulk density and TAP density were measured. The result is shown in Table 1.

Further, 92% by weight of each copper powder was kneaded with 8% by weight of an epoxy resin in a mixer of an oscillation type and viscosity of the resulting paste was measured, respectively. With regard to the epoxy resin, that which was prepared by glycidylation of dimeric acid having an epoxy equivalent of 446 g/eq and a viscosity of 0.73 Pa.sec at 25° C. was used and the kneading condition was made same for each copper powder. Viscosity of each paste was measured at 25° C. using a viscometer of type B at the rotation of 10 rpm. The result is also given in Table 1.

TABLE 1

| Cake by Wet Method | Copper Powder | Average Particle Size (μm) | Specific Surface Area (m²/g) | Bulk Density (g/cm³) | TAP Density (g/cm³) | Viscosity of Paste at 10 rpm (Pa · s) | Remarks |
|---|---|---|---|---|---|---|---|
| A | A1 | 6.80 | 0.14 | 3.78 | 4.58 | 446 | DT |
|   | A2 | 7.13 | 0.18 | 3.95 | 4.75 | 232 | FT |
| B | B1 | 5.65 | 0.18 | 3.89 | 4.72 | 656 | DT |
|   | B2 | 6.09 | 0.17 | 3.84 | 4.77 | 210 | FT |
| C | C1 | 5.78 | 0.20 | 3.90 | 4.70 | 401 | DT |
|   | C2 | 6.10 | 0.18 | 3.91 | 4.84 | 161 | FT |

DT: Disintegrating treatment
FT: Fluidizing treatment

From the result of Table 1, it is noted that, as compared with the copper powders A1, B1 and C1 which were not subjected to a fluidizing treatment, the fluidized copper powders A2, B2 and C2 show a significant decrease in the viscosity of the paste after mixing with the resin although average particle size, specific surface area, bulk density and TAP density are not so changed. The reason why the viscosity of the paste lowers in spite of little changes in particle size and specific surface area may be due to the fact that, as being clear from comparisons between FIG. 1 and FIG. 2, between FIG. 3 and FIG. 4, and between FIG. 5 and FIG. 6, angularity on the particle surface is removed giving a smooth curve plane in the fluidized ones.

The changes in the average particle size and the changes in the specific surface areas for a given copper powder, e.g., A1 versus A2 (powder of the invention) can be quantified. For example, the average particle size of A1 (based on a measurement of the individual copper particles making up the A1 powder) is 6.80 μm, and the average particle size of A2 is 7.13 μm, see Table 1. The increase in particle size of 0.33 μm in the A2 powder represents an increase in the average particle size of the A1 powder in terms of a percentage as 4.85% (7.13−6.80/6.80). Comparing the specific surface areas of powders B1 and B2, the B2 powder exhibited a 5.56% change from the B1 powder (|0.17−0.18|/ 0.18). Using this comparison, the change in average particle size and specific surface area for powders A1, A2, B1, B2, C1, and C2 are shown in the following Table 2. As can be seen from this Table, the change in average particle size varies up to 7.79%, and the average particle size hardly or substantially changes as compared to the average particle size of the powder not subjected to the surface-smoothing treatment. Likewise, the specific surface area values as measured by the BET method are rarely changed.

TABLE 2

| POWDER CAKE | Change In Average Particle Size When Powder Is Treated According To Invention | Change In Specific Surface Area When Powder Is Treated According To Invention |
|---|---|---|
| A(A1, A2) | increase of 4.85% | increase of 28.57% |
| B(B1, B2) | increase of 7.79% | increase of 5.56% |
| C(C1, C2) | increase of 5.54% | increase of 10.00% |

As fully illustrated hereinabove, it is now possible in accordance with the invention that copper powder which is able to give a paste showing a low viscosity even when kneaded with a high filling rate can be manufactured by a wet reduction method and, as a result, copper paste of a high quality can be prepared in a stable manner.

What is claimed is:

1. A copper powder for an electrically conductive paste, the copper powder manufactured by a wet reduction method and comprising individual copper particles, wherein the copper powder is subjected to a surface-smoothing treatment such that the individual copper particles mechanically collide with each other such that angular parts of the individual copper particles are made into smooth curved planes, the surface-smoothing treatment rarely changing an average particle size of the copper powder and a specific surface area of the copper powder according to a BET method.

2. The copper powder for an electrically conductive paste according to claim 1, wherein the copper powder has an average particle size of 0.1–10 μm.

3. The copper powder for an electrically conductive paste according to claim 1, wherein the wet reduction method is a method where a reducing agent is added to a suspension in which copper hydroxide is suspended in water to carry out a primary reduction giving cuprous oxide and then a reducing agent is added to a suspension in which the cuprous oxide is suspended in water to carry out a secondary reduction giving metal copper.

4. The copper powder for an electrically conductive paste according to claim 3, wherein there is an oxidizing treatment between the primary reduction treatment and the secondary reduction treatment.

5. The copper powder for an electrically conductive paste according to claim 1, wherein the copper powder manufactured by a wet reduction method is coated with an inorganic substance or an organic substance and then subjected to the surface-smoothing treatment.

6. The copper powder for an electrically conductive paste according to claim 1, wherein, when 92% by weight of the subject copper powder is kneaded with 8% by weight of an epoxy resin being prepared by glycidylation of dimeric acid, having an epoxy equivalent of 446 and having a viscosity of 0.73 Pa.sec at 25° C. and then a viscosity of the kneaded mixture is measured at 10 rpm using a viscometer of type B, the viscosity is not more than 300 Pa.sec.

7. The copper powder for an electrically conductive paste according to claim 1, wherein the rare change in the average particle size is an increase up to 7.79% as compared to an average particle size of a copper powder not subjected to the surface-smoothing treatment.

8. The copper powder for an electrically conductive paste according to claim 1, wherein the rare change in the specific surface area ranges from a decrease of 10% up to an increase of 28.57% as compared to a specific surface area of a copper powder not subjected to the surface-Smoothing treatment.

9. The copper powder for an electrically conductive paste according to claim 8, wherein the rare change in the average particle size is an increase up to 7.79% as compared to an average particle size of a copper powder not subjected to the surface-smoothing treatment.

* * * * *